(12) United States Patent
Suzuki et al.

(10) Patent No.: US 10,033,525 B2
(45) Date of Patent: Jul. 24, 2018

(54) TRANSMISSION DEVICE AND SIGNAL PROCESSING METHOD

(71) Applicant: FUJITSU LIMITED, Kawasaki-shi, Kanagawa (JP)

(72) Inventors: Masayuki Suzuki, Shimotsuga (JP); Hiroyuki Komori, Tatebayashi (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/676,951

(22) Filed: Aug. 14, 2017

(65) Prior Publication Data

US 2018/0123775 A1 May 3, 2018

(30) Foreign Application Priority Data

Oct. 31, 2016 (JP) ................................. 2016-212970

(51) Int. Cl.
*H04L 7/033* (2006.01)
*H04L 7/00* (2006.01)
*H03L 7/08* (2006.01)

(52) U.S. Cl.
CPC .......... *H04L 7/0337* (2013.01); *H03L 7/0807* (2013.01); *H04L 7/0008* (2013.01); *H04L 7/0037* (2013.01)

(58) Field of Classification Search
CPC combination set(s) only.
See application file for complete search history.

(56) References Cited

FOREIGN PATENT DOCUMENTS

JP 10-242955 9/1998
JP 10-294724 11/1998

*Primary Examiner* — An Luu
(74) *Attorney, Agent, or Firm* — Fujitsu Patent Center

(57) ABSTRACT

A transmission device includes: a reception circuit; and a transmission section that is disposed between the reception circuit and a transmission circuit and transmits a clock signal and data signals in parallel, wherein the transmission circuit performs operations of: inserting a predetermined pattern in a data invalid period of each of the data signals; outputting the each of the data signals in which the predetermined pattern has been inserted in synchronization with an input clock; and adjusting a phase of the clock signal in the data invalid period, the reception circuit performs operations of: detecting a state of a reception clock using the data signals in which the predetermined pattern has been inserted; and determining whether phase adjustment of the clock signal is to be performed, based on the state of the reception clock, and the transmission circuit adjusts the phase of the clock signal, based on a determination result.

16 Claims, 17 Drawing Sheets

TRANSMISSION DEVICE AND SIGNAL PROCESSING METHOD

CROSS-REFERENCE TO RELATED APPLICATION

This application is based upon and claims the benefit of priority of the prior Japanese Patent Application No. 2016-212970, filed on Oct. 31, 2016, the entire contents of which are incorporated herein by reference.

FIELD

The embodiment discussed herein is related to a transmission device and signal processing.

BACKGROUND

In a transmission device, digital signal processing is performed using a logic device, such as a field programmable gate array (FPGA), an application specific integrated circuit (ASIC), or the like.

Japanese Laid-open Patent Publication No. 10-294724 or Japanese Laid-open Patent Publication No. 10-242955 discusses the related art.

SUMMARY

According to an aspect of the invention, a transmission device includes: a reception circuit; and a transmission section that is disposed between the reception circuit and a transmission circuit and transmits a clock signal and a plurality of data signals in parallel, wherein the transmission circuit performs operations of: inserting a predetermined pattern in a data invalid period of each of the data signals; outputting the each of the data signals in which the predetermined pattern has been inserted in synchronization with an input clock; and adjusting a phase of the clock signal in the data invalid period, the reception circuit performs operations of: detecting a state of a reception clock using the each of the data signals in which the predetermined pattern has been inserted; and determining whether or not phase adjustment of the clock signal is to be performed, based on the state of the reception clock, and the transmission circuit adjusts the phase of the clock signal, based on a determination result.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

Figure 1:
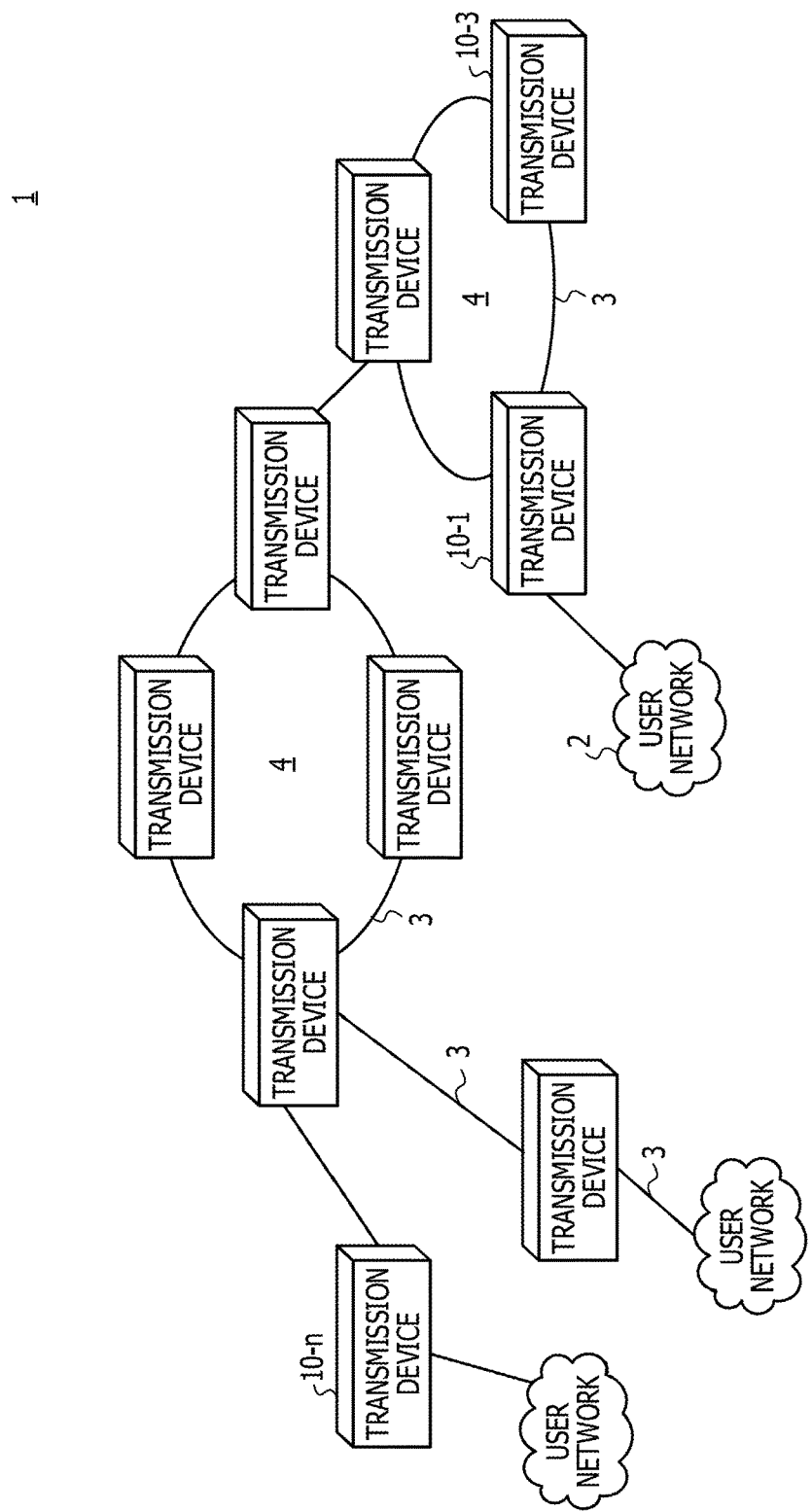
FIG. 1 illustrates an exemplary network.

Digital signal transmission schemes include an interface scheme in which data and a clock are transmitted as a set through separate signal lines. For example, data and a clock are transmitted and received in parallel between logic devices or between chips in a transmission device using a single clock line and n (n is an integer) data lines.

In order to correctly take in data at a reception side, a delay that occurs between units, boards, chips, or the like inside a transmission device is considered, and a physical delay element is inserted for each clock wiring or each data wiring in a reception side chip. A timing of taking in data at an interface is adjusted by inserting the delay element. For example, as the capacity of networks increases, the frequency of a clock that is to be interfaced increases and the number of data lines that are disposed in parallel increases. For example, increase in the degree of integration of FPGA/ASIC and microfabrication of a process cause increase in process variation of a delay element in a chip, and thus a fluctuation range of a delay amount due to an environmental condition (temperature, power supply voltage, or the like) increases. Therefore, in the reception side chip, it may be difficult to perform adjustment of an interface timing at which data is correctly taken in using a reception clock.

For example, in a data communication device, a clock phase correction circuit adjusts a phase between a clock signal and a data signal that are input. For example, in a parallel burst transmission, a configuration in which the size of a reception circuit for N burst parallel signals is reduced is provided. In each of these techniques, input data is determined using a plurality of clock signals of different phases. In the former, a clock signal with which input data is stably taken in is selected from a plurality of clock signals at a reception side. In the latter, a clock of an optimal phase is selected by correlation processing between a keyword pattern that has been held in advance and a parallel bit pattern of N parallel identification signals.

In a configuration in which a physical delay element is inserted in a clock wiring or a data wiring, physical design is employed considering device characteristics, such as, for example, a clock characteristic, an input and output characteristic, or the like, and an arrangement or wirings in a chip. For example, microfabrication of a process and increase in the degree of integration cause increase in process variation of wirings in the chip and the delay element, and a fluctuation range of a delay amount increases due to an environmental factor. There may be a limit in dealing with design of an interface, process speed of which is expected to be further increased, using a physical delay element.

For example, in a method in which a plurality of clocks of different phases is used, the number of clocks is increased and physical clock design may be complicated. For example, a circuit that monitors and determines input data using a plurality of clocks may be desired. When the number of input data which are transmitted in parallel is increased, the size of the circuit that monitors and determines data or the number of such circuit is increased in proportion to the number of input data. Due to increase in speed of transmission in a transmission path, increase in clock signal transmission speed (increase in clock frequency) and increase in the number of data are expected and it may be difficult to perform physical design for processing a plurality of clocks of different phases.

For example, a transmission device and a signal processing method in which, without using a physical delay element, timing adjustment of an internal interface is performed in a simple circuit configuration may be provided.

For example, at a transmission side, a certain pattern is inserted in a data invalid period between data latched using a common clock. At a reception side, an input clock is monitored using the certain pattern that has been inserted in the data invalid period. For example, the state of the common clock is detected in each data that has been received. It is determined, based on a detection result, whether or not phase adjustment of a clock signal is desired to be performed, and a determination result is fed back to the transmission side.

FIG. 1 illustrates an exemplary network. In FIG. 1, transmission devices are used and a predetermined signal processing method is applied. A network 1 includes a plurality of transmission devices 10-1 to 10-n. The transmission devices 10-1 to 10-n (hereinafter collectively referred to as "transmission devices 10", as appropriate) are coupled with one another via transmission paths 3 of a wide area network. Some of the transmission devices 10 form a sub network 4 and the sub networks 4 or the sub network 4 and a user network are coupled via the corresponding transmission path 3 using an optical fiber or the like.

Figure 2:
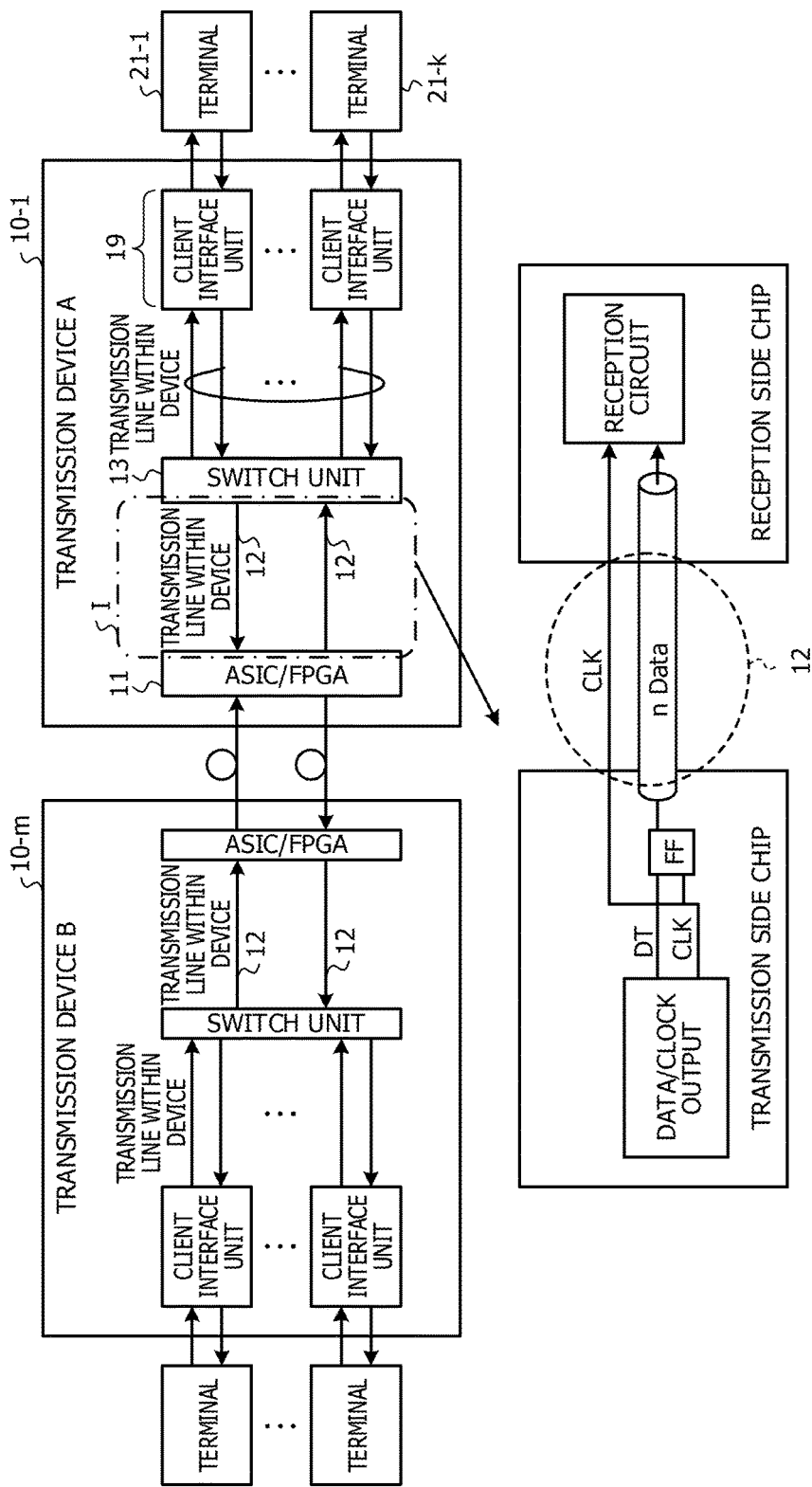
FIG. 2 illustrates exemplary transmission devices.

FIG. 2 illustrates exemplary transmission devices. The transmission devices illustrated in FIG. 2 may be the transmission devices 10 illustrated in FIG. 1. A transmission device A (10-1) and a transmission device B (10-m) that are coupled to one another via the transmission path 3 may have the same configuration or similar configurations to one another and perform a communication between the transmission devices 10 and a communication with a client device or a terminal 20 included in the user network.

When the transmission device 10-1 is focused on, the transmission device 10-1 includes a network interface unit 11, a switch unit 13, and a client interface unit 19. At least a part of the network interface unit 11 is realized by a logic device, such as FPGA, ASIC, or the like, and performs interface processing of a signal that is transmitted and received to and from the network 1. The client interface unit 19 performs interface processing of a signal that is transmitted and received to and from the terminals 20-1 to 20-k. The switch unit 13 couples a signal that has been received from the network 1 or a signal that is transmitted to the network 1 to an appropriate port. The network interface unit 11 and the switch unit 13 are coupled with one another via a transmission path 12 in the transmission device 10-1. The switch unit 13 and the client interface unit 19 are coupled with one another via a transmission path 14.

In an interface area I in which the network interface unit 11 and the switch unit 13 are coupled with one another, high-speed interface processing is performed between a transmission side chip and a reception side chip. In the transmission path 12, data and a clock are transmitted and received using a plurality of (n) data lines and a clock line. The clock line and the n data lines may form parallel paths.

Figure 3:
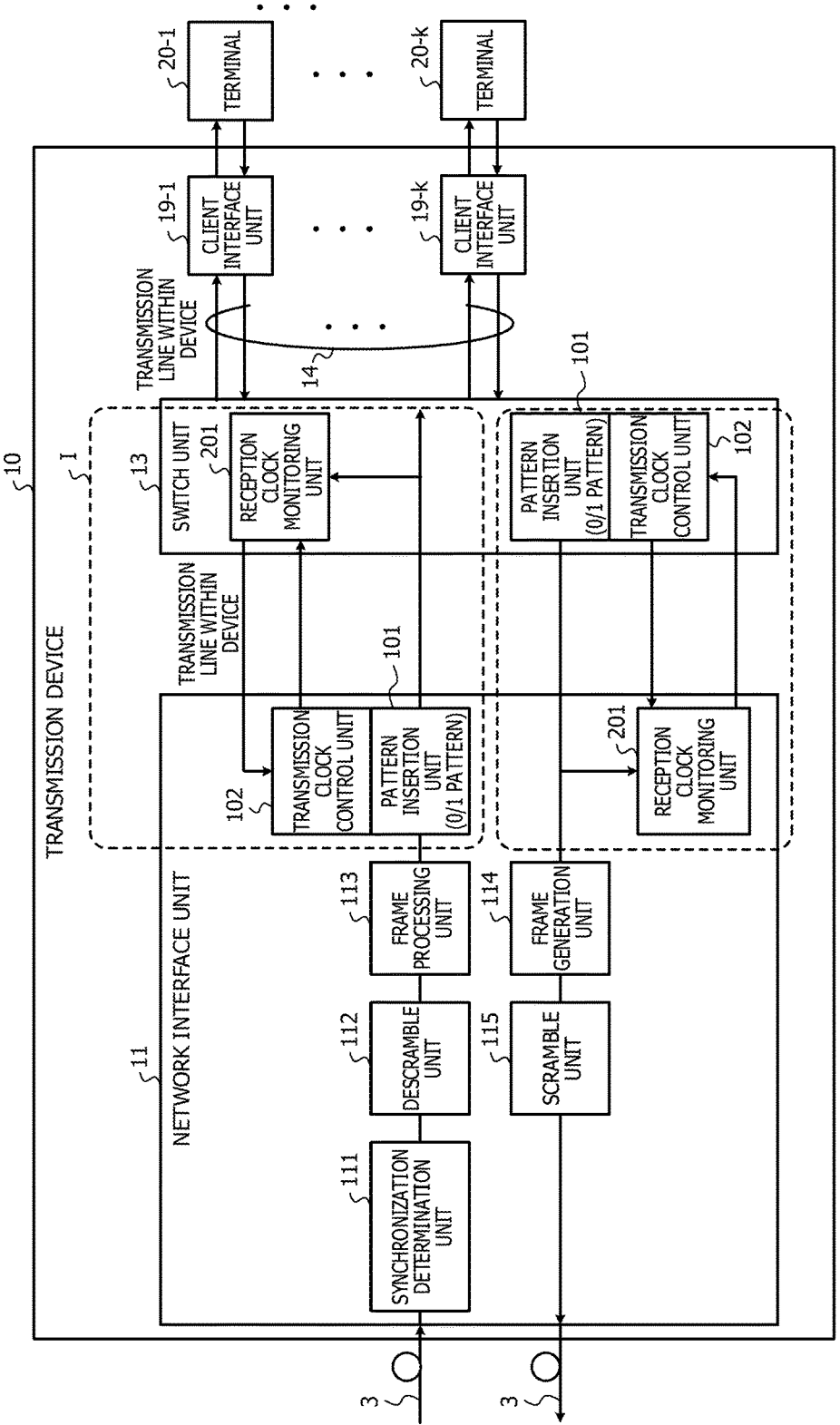
FIG. 3 illustrates an exemplary transmission device.

FIG. 3 illustrates an exemplary transmission device. The transmission device illustrated in FIG. 3 may be one of the transmission devices illustrated in FIG. 1 or FIG. 2. The network interface unit 11 is realized by a logic device, such as FPGA, ASIC, or the like, and performs interface processing of a signal that is transmitted and received to and from a network via the corresponding transmission path 3. A reception system of the network interface unit 11 includes a synchronization determination unit 111, a descramble unit 112, a frame processing unit 113, a pattern insertion unit 101, and a transmission clock control unit 102. A transmission system of the network interface unit 11 includes a reception clock monitoring unit 201, a frame generation unit 114, and a scramble unit 115.

A reception system of the switch unit 13 includes a reception clock monitoring unit 201 and a transmission system of the switch unit 13 includes a pattern insertion unit 101 and a transmission clock control unit 102.

In the interface area I between the network interface unit 11 and the switch unit 13, when a signal that has been received from the network is transmitted to a chip in a next stage, the network interface unit 11 may serve as a transmission side chip and the switch unit 13 may serve as a reception side chip. When data that has been received from the terminal 20 is transmitted to the network, the switch unit 13 may serve as a transmission side chip and the network interface unit 11 may serve as a reception side chip. Each of the network interface unit 11 and the switch unit 13 includes a transmission circuit including the pattern insertion unit 101 and the transmission clock control unit 102 and a reception circuit including the reception clock monitoring unit 201.

For example, a predetermined pattern is inserted in a data invalid period by the pattern insertion unit 101 of the transmission side chip. The predetermined pattern may be, for example, a 0/1 alternate pattern in which "0" and "1" are alternately repeated. The reception clock monitoring unit 201 of the reception side chip latches a reception clock for each of a plurality of data using the pattern inserted in the invalid period and feeds back a latch result to the transmission clock control unit 102 of the transmission side chip. The transmission clock control unit 102 adjusts a timing of clock transmission, based on a feedback result.

Figure 4:
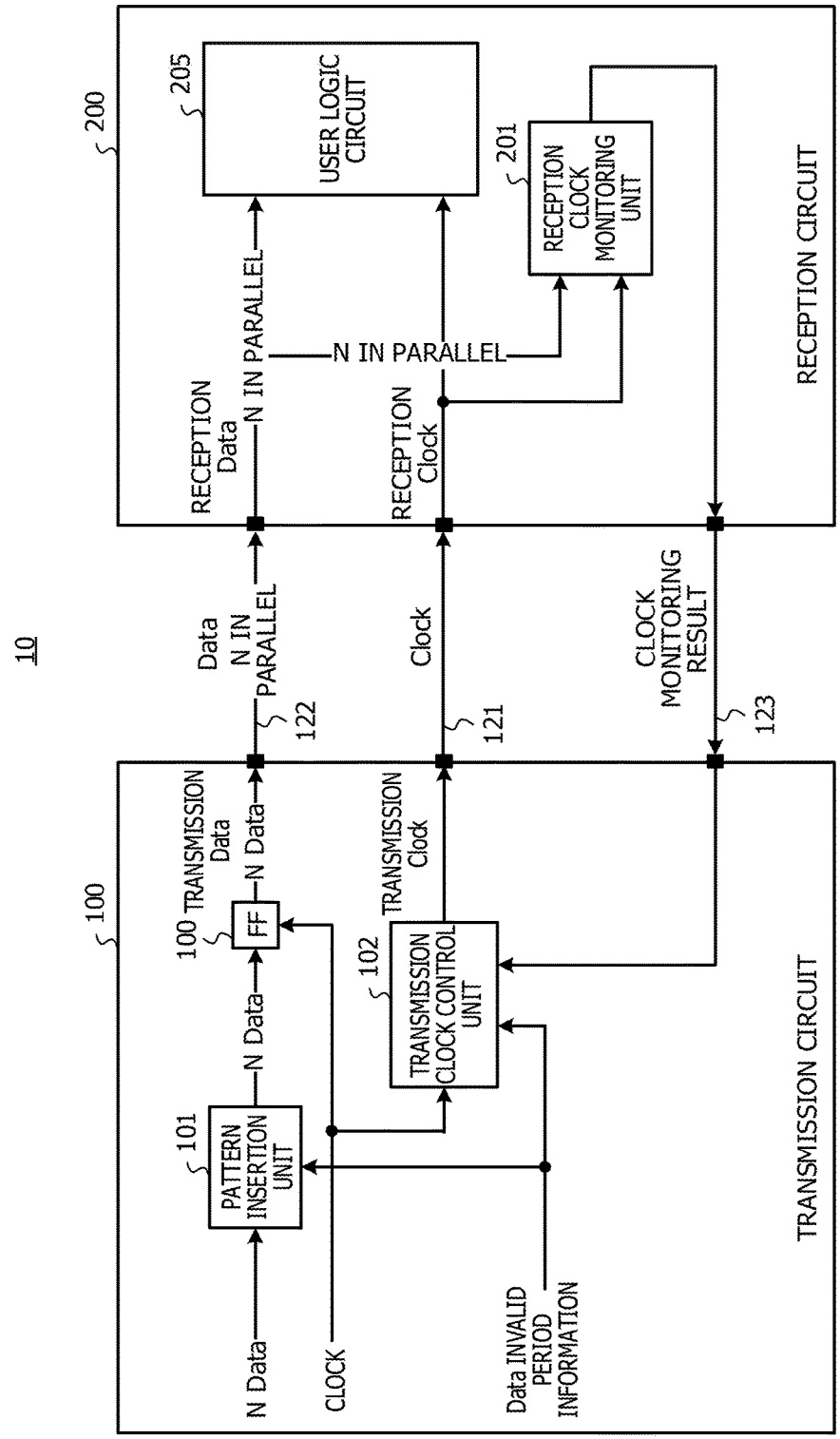
FIG. 4 illustrates an exemplary circuit configuration of an interface area inside a transmission device.

FIG. 4 illustrates an exemplary circuit configuration of an interface area inside a transmission device. The transmission device 10 includes a transmission circuit 100 and a reception circuit 200 that perform an interface of signal transmission and reception in the transmission device 10. As described above, when the transmission device 10 receives data from a network, for example, a part of the network interface unit 11 serves as the transmission circuit 100 and a part of the switch unit 13 serves as the reception circuit 200. When the transmission device 10 transmits data to a network, for example, a part of the switch unit 13 serves as the transmission circuit 100 and a part of the network interface unit 11 serves as the reception circuit 200.

In the transmission circuit 100, a pattern insertion section 101 inserts a predetermined pattern, for example, the 0/1 alternate pattern, in an invalid period of each of the N parallel data, based on data invalid period information that is supplied from outside. The data invalid period information may be supplied from, for example, the frame processing unit 113 of FPGA/ASIC. The N data in which the predetermined pattern has been inserted is input to a logic circuit 105 including N flip-flops (FFs). Each of the flip-flops of the logic circuit 105 adjusts (performs retiming on) the phase of each of the data using a common clock signal. The data on which retiming has been performed are transmitted to the reception circuit 200 through N parallel signal lines 122.

The data invalid period information is input to the pattern insertion section 101 and the transmission clock control unit 102. The common clock signal is input to the logic circuit 105 and the transmission clock control unit 102. The transmission clock control unit 102 receives a clock monitoring result from the reception circuit 200.

The transmission clock control unit 102 adjusts a timing of an interface using the data invalid period. In order to adjust an interface timing, the transmission clock control unit 102 generates clock signals of different phases, based on clocks that have been input, and selects an optimal clock signal from a plurality of clock signals, based on a feedback signal from the reception circuit 200. The selected clock signal is transmitted to the reception circuit 200 through a clock signal line 121 in parallel to the data signal into which the predetermined pattern has been inserted.

Even if a plurality of clock signals of different phases have been generated in the transmission clock control unit 102, only a single clock is transmitted to the reception circuit 200, and therefore, the number of clock signal lines may not be increased.

In the reception circuit 200, the data that have been transmitted through the N parallel signal lines 122 are input to a user logic circuit 205 and a reception clock monitoring unit 201. The clock signal that has been transmitted through the clock signal line 121 is also input to the user logic circuit 205 and the reception clock monitoring unit 201. The user logic circuit 205 latches each data using a common clock signal.

The reception clock monitoring unit 201 detects a rise of a single clock signal using N data and monitors whether or not a phase relation between data and a clock is appropriately maintained. A monitoring result of monitoring performed by the reception clock monitoring unit 201 is fed back to the transmission clock control unit 102 of the transmission circuit 100.

Figure 5:
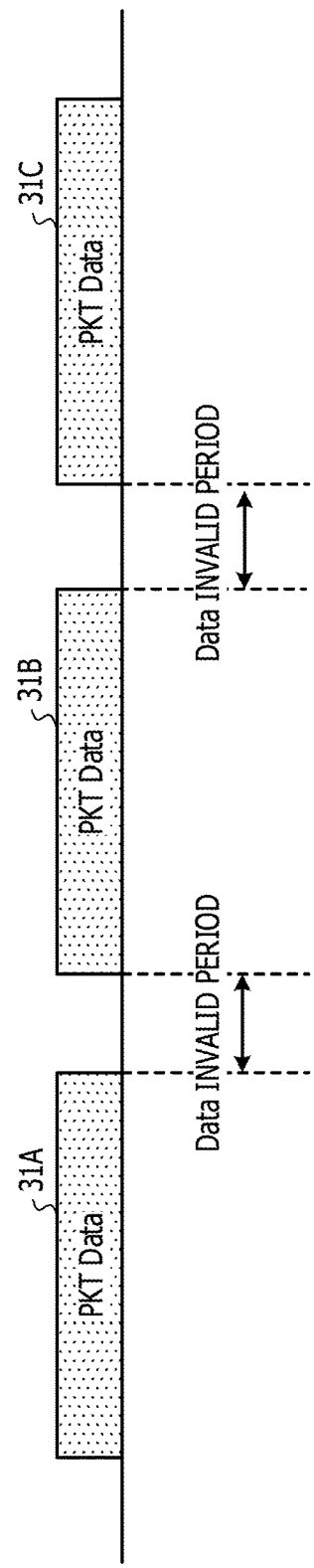
FIG. 5 illustrates an exemplary transmission scheme in which an invalid interval is provided between data.

FIG. 5 illustrates an exemplary transmission scheme in which an invalid period is provided between data. In transmission of packet data 31A, 31B, 31C, . . . , for example, an invalid period in which there is no data is inserted between data and data, for example, so that saturation of a buffer does not occur. For example, a predetermined pattern, such as the 0/1 alternate pattern or the like, is inserted in the data invalid period and an interface timing is adjusted using the pattern that has been inserted in the data invalid period.

Figure 6:
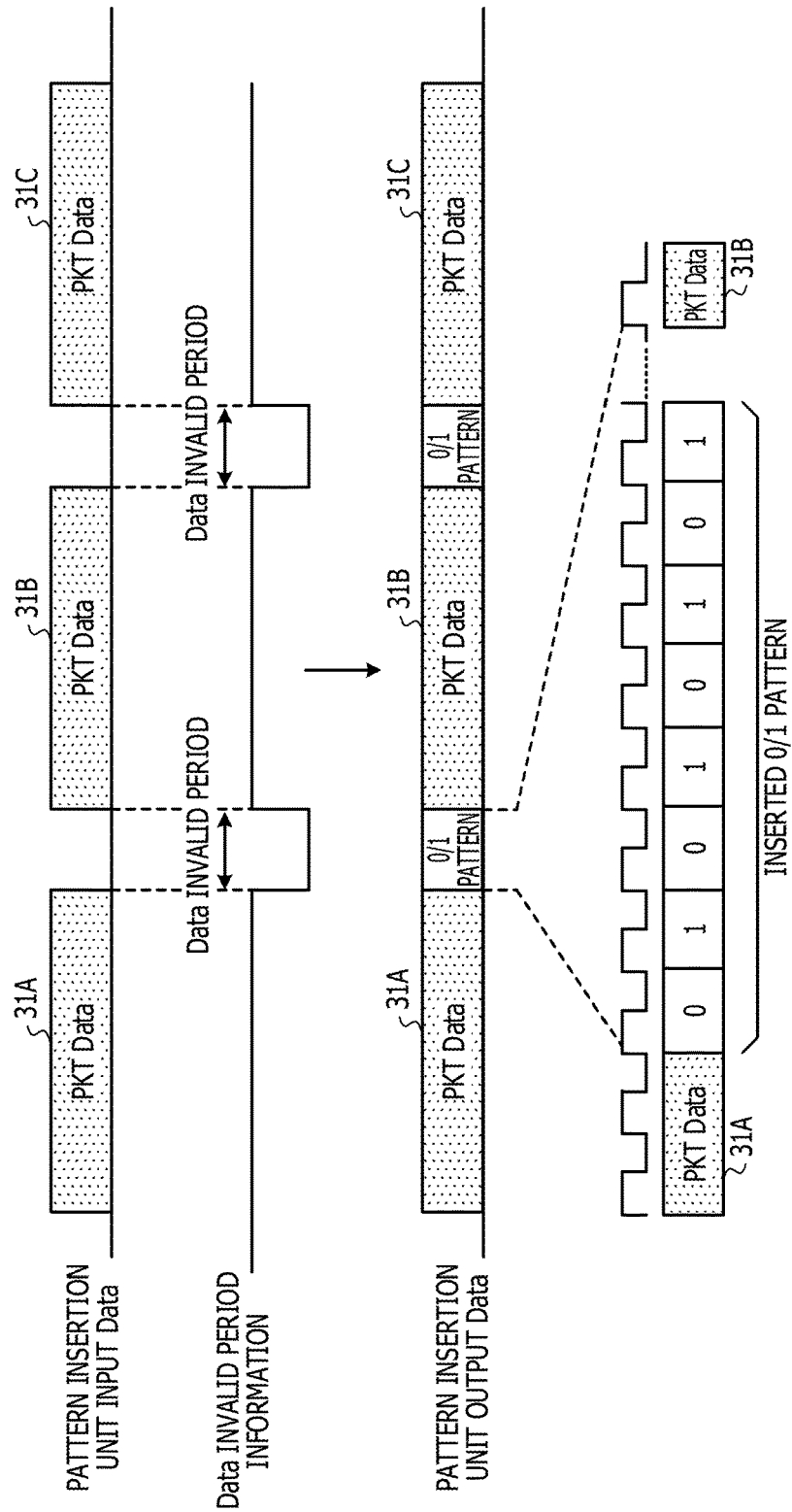
FIG. 6 illustrates exemplary pattern insertion.

FIG. 6 illustrates exemplary pattern insertion. In FIG. 6, insertion of the 0/1 alternate pattern in the data invalid period performed by the pattern insertion section 101 is illustrated. When packet data is input, the pattern insertion section 101 specifies an invalid period, based on data invalid period information, and inserts a predetermined pattern in the invalid period. For example, the 0/1 alternate pattern in which "0" and "1" are repeated is inserted. The predetermined pattern might not be inserted throughout the data invalid period and a part of the data invalid period may be used. For example, it is preferable that the number of patterns which is inserted in the corresponding data invalid period is larger than the number of clocks of different phases which are generated in the transmission clock control unit 102. For example, if the predetermined pattern is the 0/1 alternate pattern and j clocks of different phases are generated in the transmission clock control unit 102, it is preferable that (j+1) or more groups of "01" are inserted. This is because, when the phase is sequentially shifted in order to select an optimal phase in the transmission clock control unit 102, the phase returns back to the initial phase at a (j+1)th group.

Figure 7:
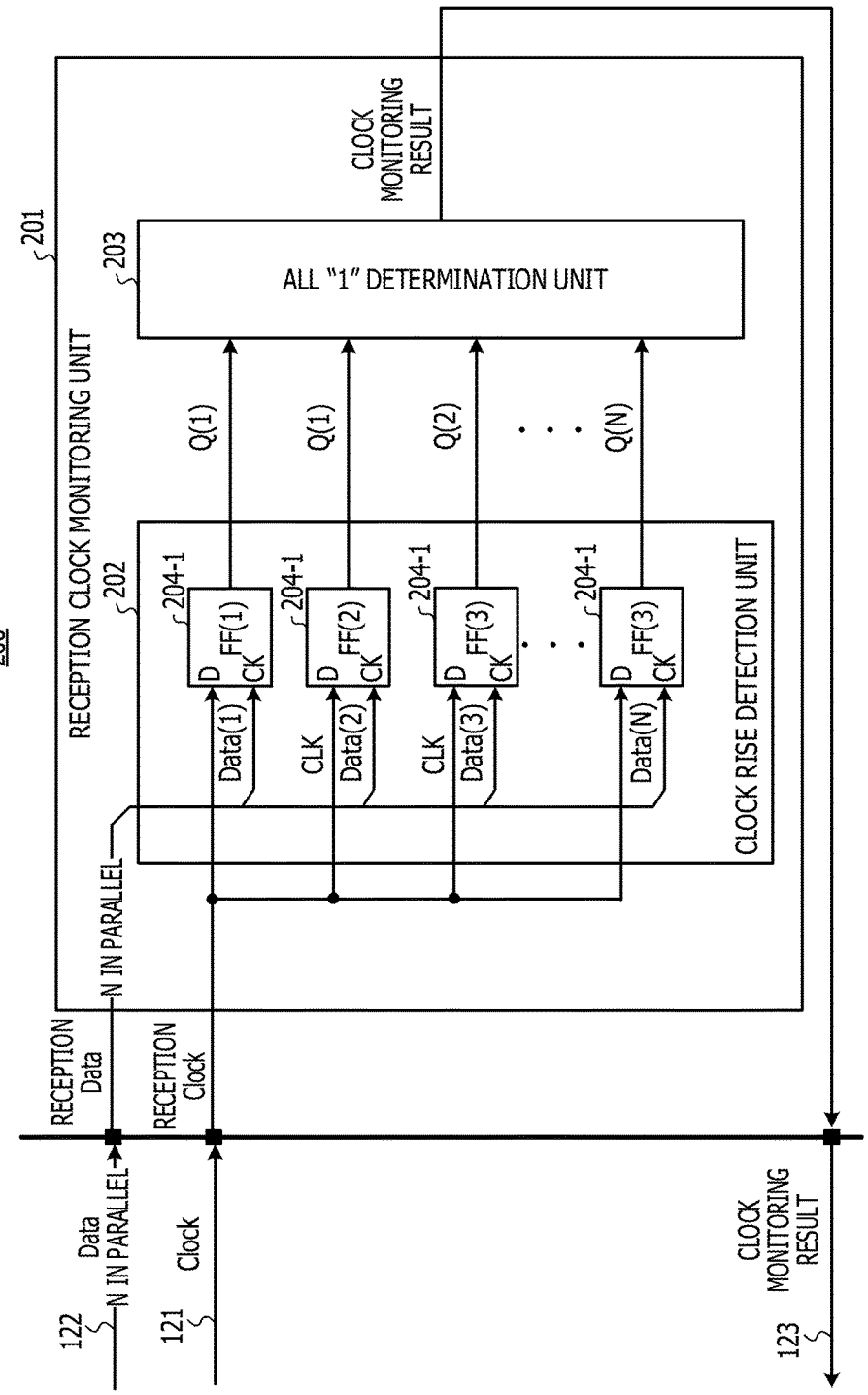
FIG. 7 illustrates an exemplary reception clock monitoring unit at a reception side.

FIG. 7 illustrates an exemplary reception clock monitoring unit at a reception side. FIG. 7 illustrates a configuration of the reception clock monitoring unit 201 of the reception circuit 200. The reception clock monitoring unit 201 includes a clock rise detection unit 202 and an all 1 determination unit 203. The clock rise detection unit 202 includes the same number of FFs 204-1 to 204-N as the number of reception data. In each FF 204, a common clock is input to a D terminal and the corresponding one of the N data is input to a CK terminal. In each FF 204, at a timing of a rise of the data that is input to the CK terminal, the state of the clock that has been input to the D terminal is held and output from a Q terminal.

The all 1 determination unit 203 determines whether or not each of outputs of all of the FFs 204 is "1" and feeds back a determination result as a clock monitoring result to the transmission circuit 100 through a signal line 123. For example, if an output of the FF 204 is "1", it may be meant that the phase relation between a clock and data is appropriately maintained. If each of the outputs of all of the FFs 204 is "1", the clock monitoring result is "affirmative". If even one of the outputs of the FFs 204 is not "1", the clock monitoring result is "negative" and clock phase adjustment is performed in the transmission circuit 100. The all 1 determination unit 203 may be an exemplary determination circuit that determines an output result from each FF 204. When the determination circuit is formed of an AND circuit, if each of output values of all of the FFs 204 is "1", "High" or "1" is output as an affirmative monitoring result.

Figure 8:
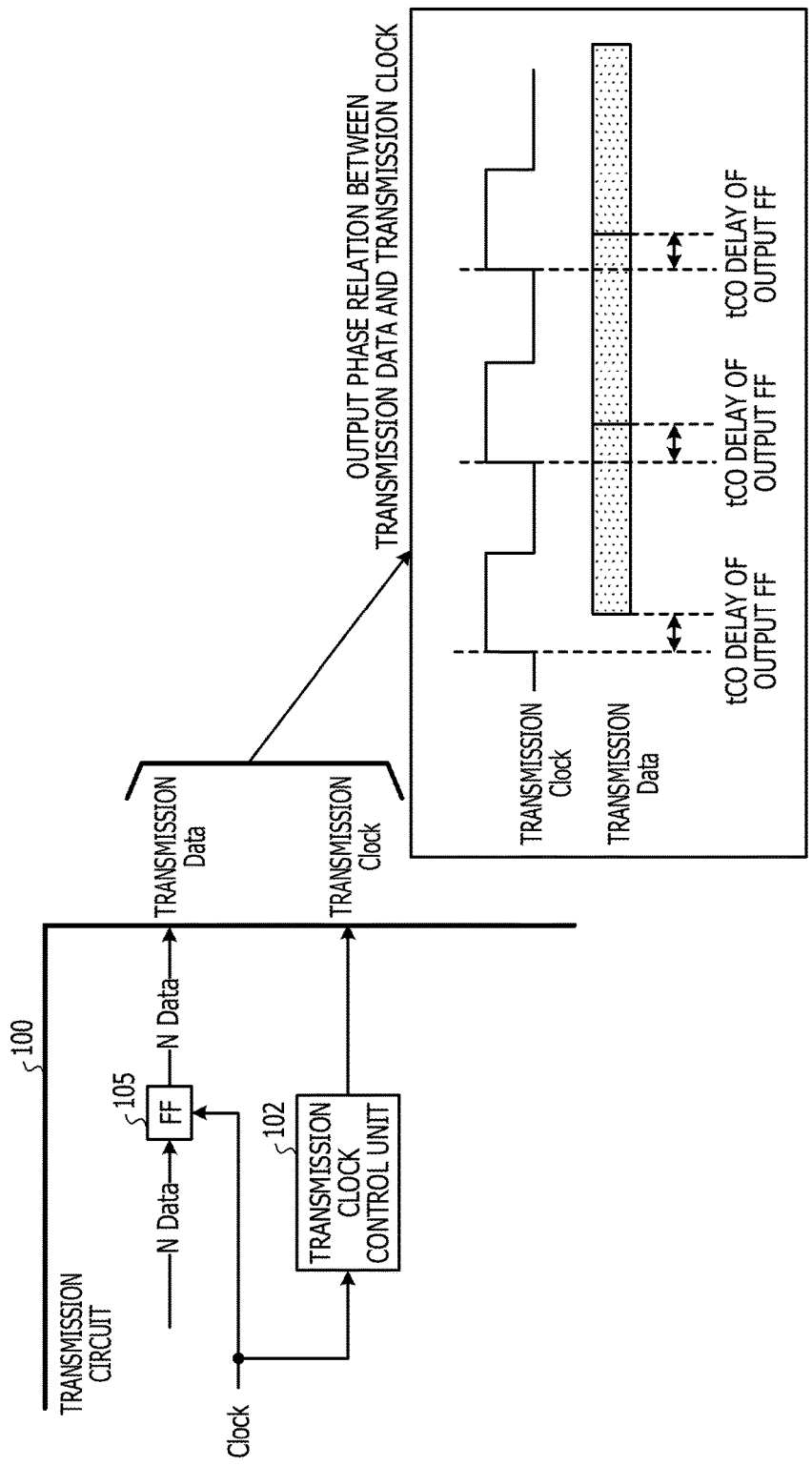
FIG. 8 illustrates an exemplary phase relation between data and a clock that are output from a transmission side.

FIG. 8 illustrates an example of the phase relation between data and a clock that are output from a transmission side. In FIG. 8, a phase relation between data and a clock that are output from the transmission circuit 100 is described. Retiming has been performed on data that is output from the transmission circuit 100 using a transmission clock in each FF of the logic circuit 105. Accordingly, data is output at a timing delayed by an output delay time (tCO; clock to output) of a FF from a clock input to a data output. The reception clock monitoring unit 201 determines, using the 0/1 alternate pattern that has been inserted in the data invalid period, whether or not a phase relation between a transmission clock and transmission data that are output from the transmission side, for example, a delay time of tCO, is maintained as it is.

Figure 9:
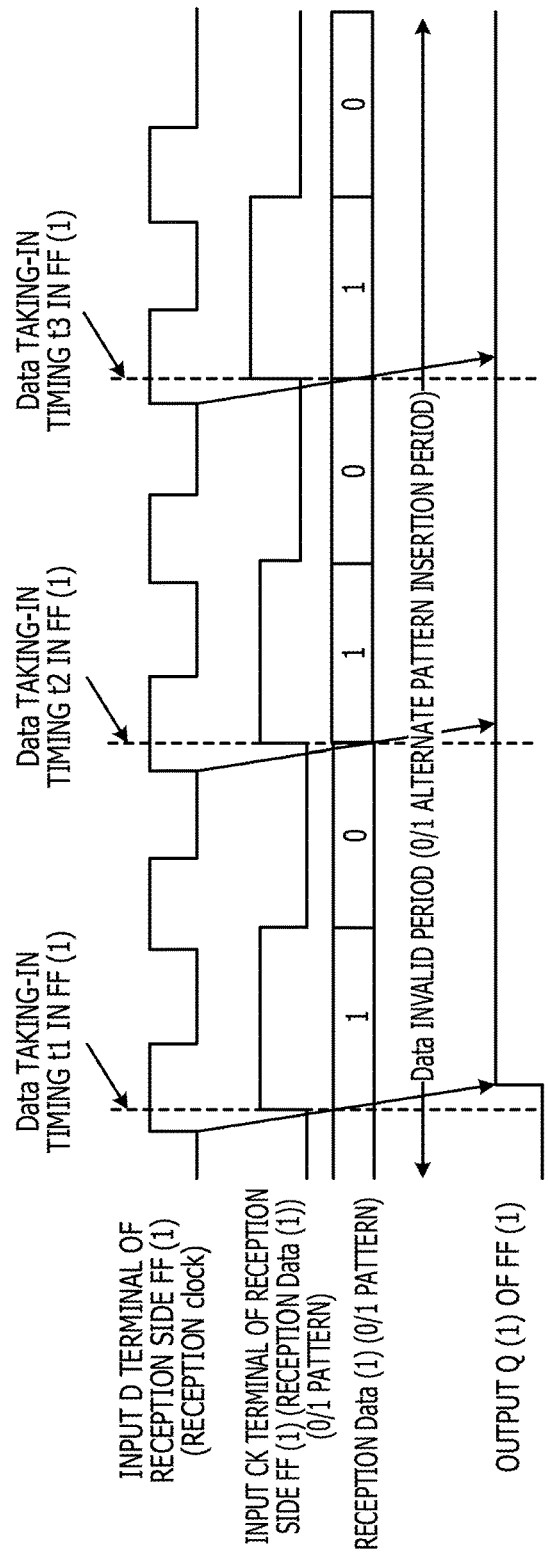
FIG. 9 illustrates an exemplary operation of a reception side flip-flop.

FIG. 9 illustrates an exemplary operation of a reception side flip-flop. In FIG. 9, an operation of a reception side FF 204 when the phase relation between transmission data and a transmission clock is maintained until the transmission data and the transmission clock reach a reception side is illustrated. Operations of the FFs 204-1 to 204-N are substantially the same and, for example, the operation of the FF 204-1 (for example, FF (1)) is described. A top part of FIG. 9 illustrates a waveform of a reception clock that is input to the D terminal of FF (1) of the clock rise detection unit 202. A second part from the top in FIG. 9 illustrates a waveform of reception data, for example, the 0/1 alternate pattern, which is input to the CK terminal of FF (1). A third part from the top illustrates a data value of 0/1 data. A bottom part illustrates an output waveform of FF (1).

At a change point of reception data (the 0/1 alternate pattern) from "0" to "1", for example, at a rising edge of the reception data, the state ("High" or "Low") of the reception clock at that time is monitored. In FIG. 9, at a rising edge of the reception data at a timing t1, the state of the reception clock is "High". Accordingly, an output of FF (1) is "1". Also, at a next data taking-in timing t2 (a rising edge of the reception data), the state of the reception clock is "High" and "1" is output from FF (1). A latch result at a data timing t3 is also "1". This operation is performed in each of the FFs 204-1 to 204-N. The change point of the reception data from "0" to "1" is a monitoring position, and therefore, as illustrated in FIG. 7, the reception data is input to the CK terminal of the FF 204 and the reception clock of a monitoring target is input to the D terminal of the FF 204.

Figure 10:
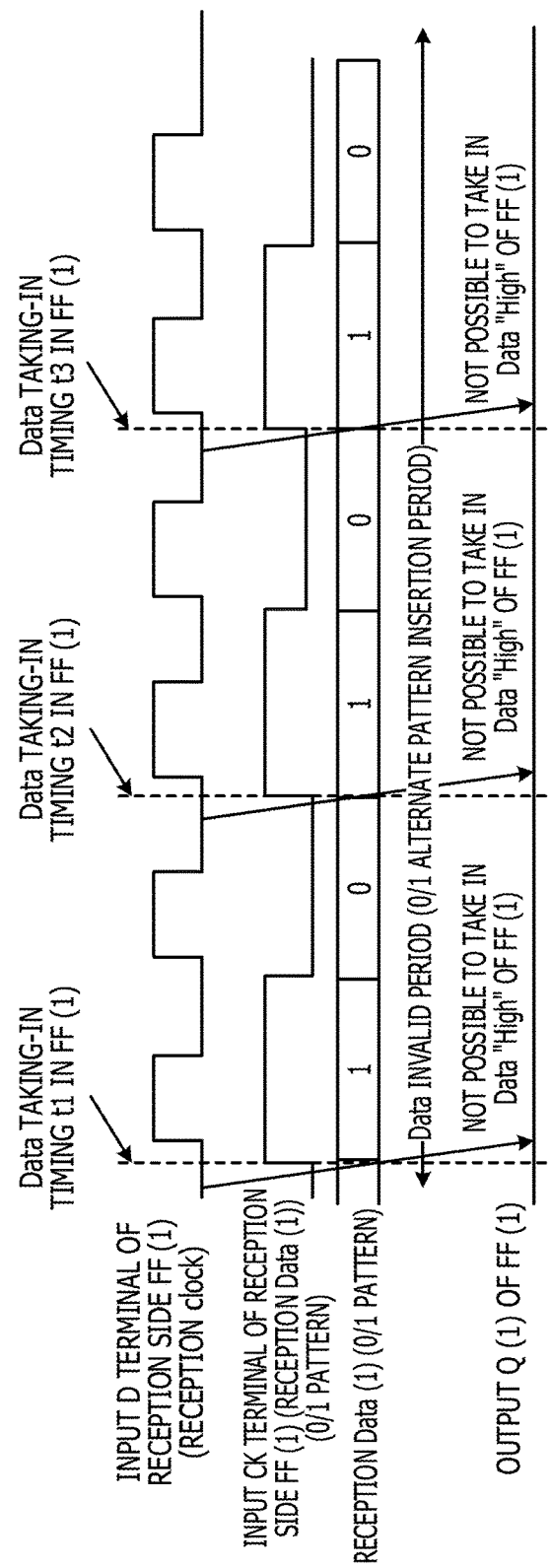
FIG. 10 illustrates an exemplary operation of a reception side flip-flop.

FIG. 10 illustrates an exemplary operation of a reception side flip-flop. In FIG. 10, an operation example 1 of the reception side FF 204 when the phase relation between transmission data and a transmission clock is not maintained until the transmission data and the transmission clock reach a reception side chip is illustrated. The operation example 1 may be an example in which the phase of a clock has been delayed relative to data. Similarly to FIG. 9, FF (1) of the reception clock monitoring unit 201 latches the state of the reception clock at a rising edge of the reception data. At the timing t1 at which the reception data, for example, the 0/1 alternate pattern that has been inserted in the data invalid period, is taken in, the state of the reception clock is "Low". Because the "High" state of the D terminal is not taken in at a rising timing of an input to the CK terminal of FF (1), the output of FF (1) is "0". Also, at each of the timings t2 and t3 at which data is taken in to the CK terminal, the output of FF (1) is "0". When "0" is output at one of the FFs 204 at a certain timing, a determination result of the all 1 determination unit 203 is "negative".

Figure 11:
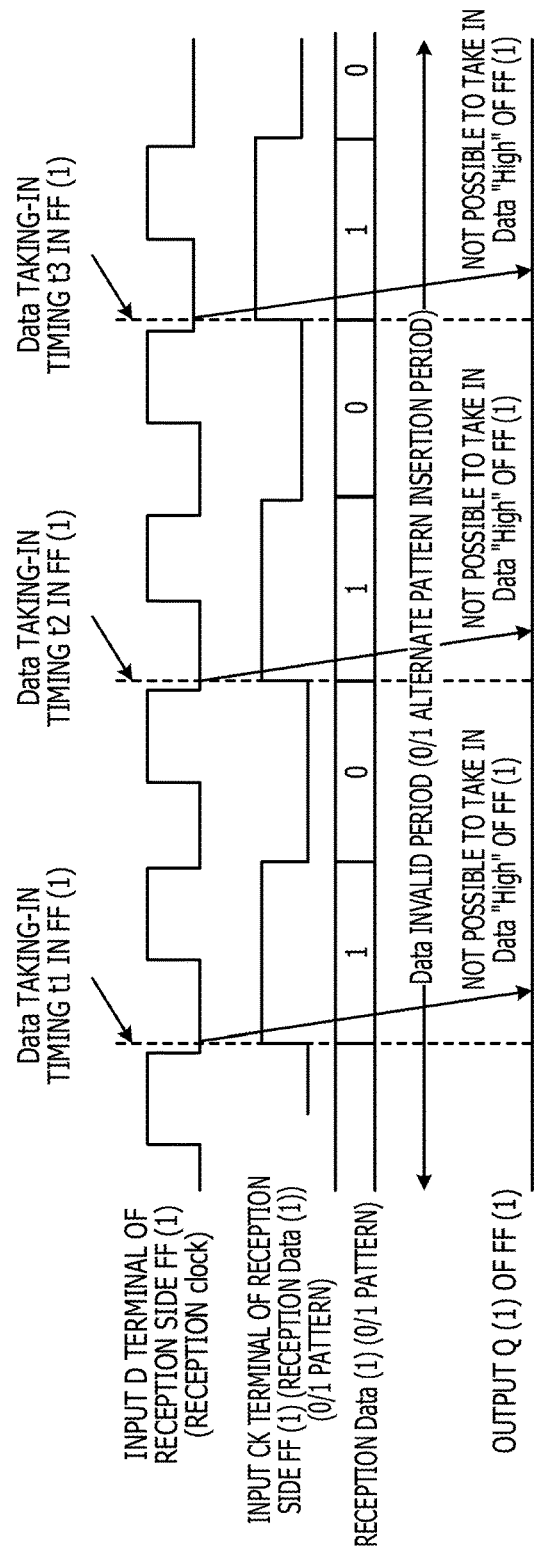
FIG. 11 illustrates an exemplary operation of a reception side flip-flop.

FIG. 11 illustrates an exemplary operation of a reception side flip-flop. In FIG. 11, an operation example 2 of a reception side FF 204 when the phase relation between transmission data and a transmission clock is not maintained until the transmission data and the transmission clock reach a reception side chip is illustrated. The operation example 2 may be an example in which the phase of a clock is advanced relative to data. Similarly to FIG. 9, FF (1) of the reception clock monitoring unit 201 latches the state of a reception clock at a rising edge of reception data. At the timing t1 at which the reception data, for example, the 0/1 alternate pattern that has been inserted in the data invalid period, is taken in, the state of the reception clock is "Low". Because the "High" state of the D terminal is not taken in at a rising timing of an input to the CK terminal of FF (1), the output of FF (1) is "0". Also, at each of the timings t2 and t3 at which data is taken in to the CK terminal, the output of FF (1) is "0". When "0" is output at one of the FFs 204 at a certain timing, a determination result of the all 1 determination unit 203 is "negative" and, for example, "Low" or "0" is output.

The all 1 determination unit 203 outputs, as a clock monitoring result, whether or not interface timing adjustment of data and a clock at a transmission side is desired to be performed, based on a determination result of a determination that has been performed for each data in each FF 204.

Figure 12:
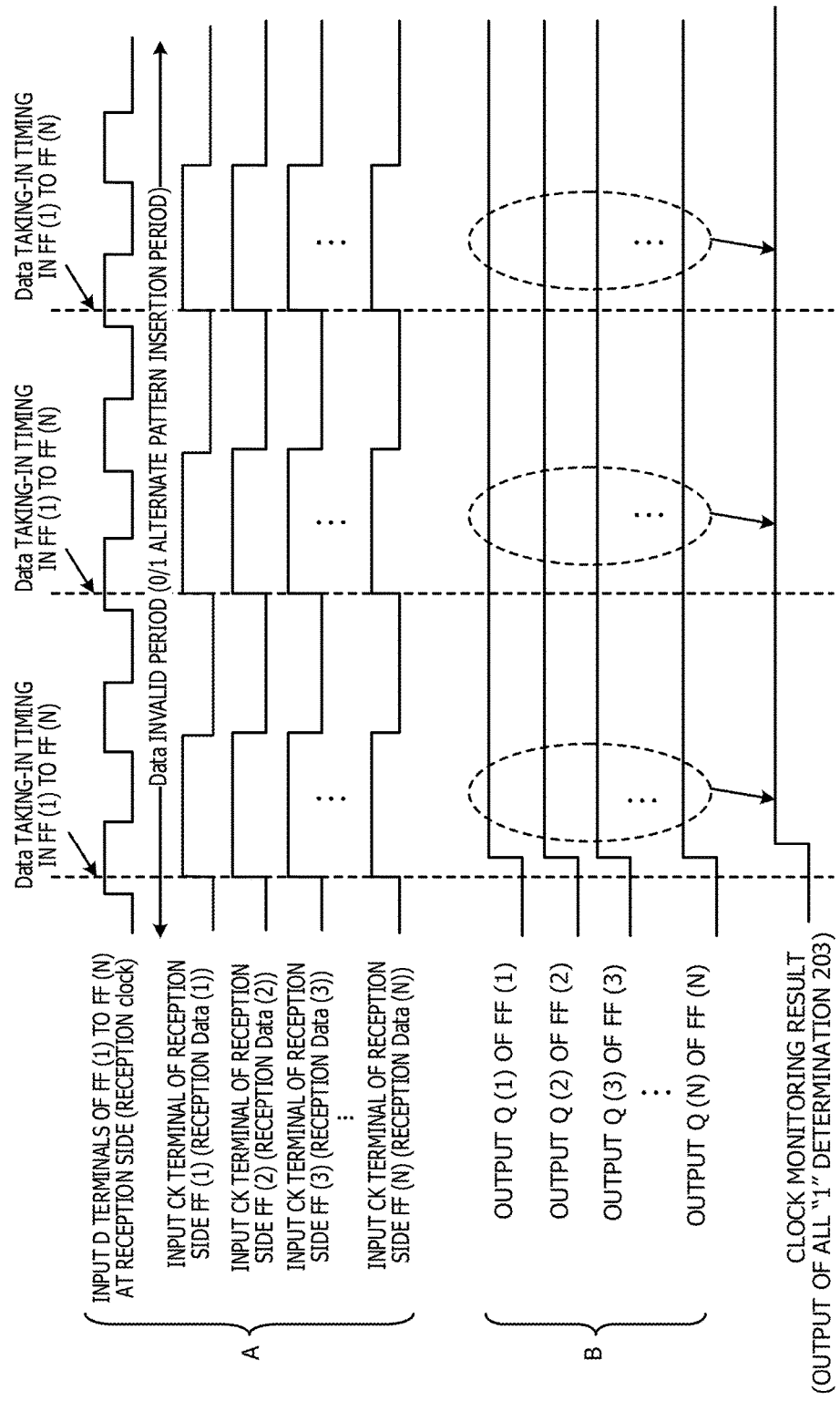
FIG. 12 illustrates an example in which it is determined that interface timing adjustment is not desired.

FIG. 12 illustrates an example in which it is determined that interface timing adjustment is not desired to be performed. FIG. 12 describes a case where it is determined in the reception clock monitoring unit, for example, the all 1 determination unit 203, that interface timing adjustment is not desired to be performed. In FIG. 12, an upper part A illustrates input waveforms to the D terminals and the CK terminals of FF (1) to FF (N). A middle part B illustrates output waveforms from the Q terminals of FF (1) to FF (N). A bottom part illustrates an output waveform of a clock monitoring result in the all 1 determination unit 203.

At each rising edge of all of FF (1) to FF (N), the state of the reception clock that has been input to the D terminal is "High" and each output value of all the Q terminals of FF (1) to FF (N) is "1". In this case, the output of the all 1 determination unit 203 is "High".

Figure 13:
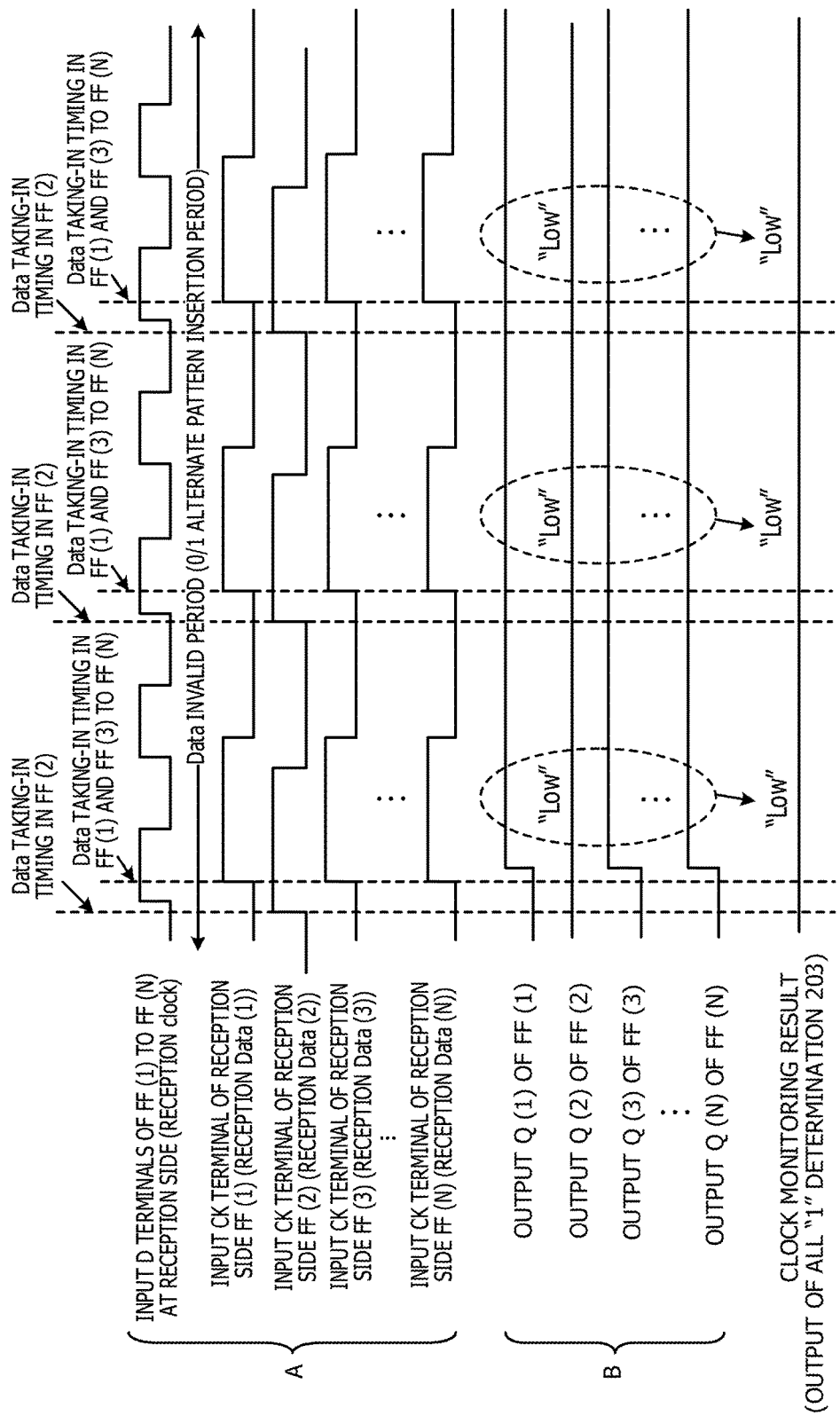
FIG. 13 illustrates an example in which it is determined that interface timing adjustment is desired.

FIG. 13 illustrates an example in which it is determined that interface timing adjustment is desired to be performed. FIG. 13 describes a case where it is determined in the reception clock monitoring unit, for example, the all 1 determination unit 203, that interface timing adjustment is desired to be performed. In FIG. 13, an upper part A illustrates input waveforms to the D terminals and the CK terminals of FF (1) to FF (N). A middle part B illustrates output waveforms from the Q terminals of FF (1) to FF (N). A bottom part illustrates an output waveform of a clock monitoring result in the all 1 determination unit 203.

In FIG. 13, at each of rising edges of FF (1) and FF (3) to FF (N), the state of the reception clock that has been input to the D terminal is "High" and each of outputs from FF (1) and FF (3) to FF (N) is "1". At a rising edge of FF(2), the state of the reception clock is "Low". In FF(2), the High state of a clock at a rise (a change point from "0" to "1") of data that has been input in the CK terminal is not taken in, and the output value of FF(2) is "Low" or "0". In an output of the clock rise detection unit 202, a value "0" that is output from FF(2) is included, and therefore, an output of the all 1 determination unit 203 is "Low".

The output of the all 1 determination unit 203 in each of FIG. 12 and FIG. 13 is fed back as a clock monitoring result to the transmission circuit 100 of a transmission side chip and is input to the transmission clock control unit 102.

Figure 14:
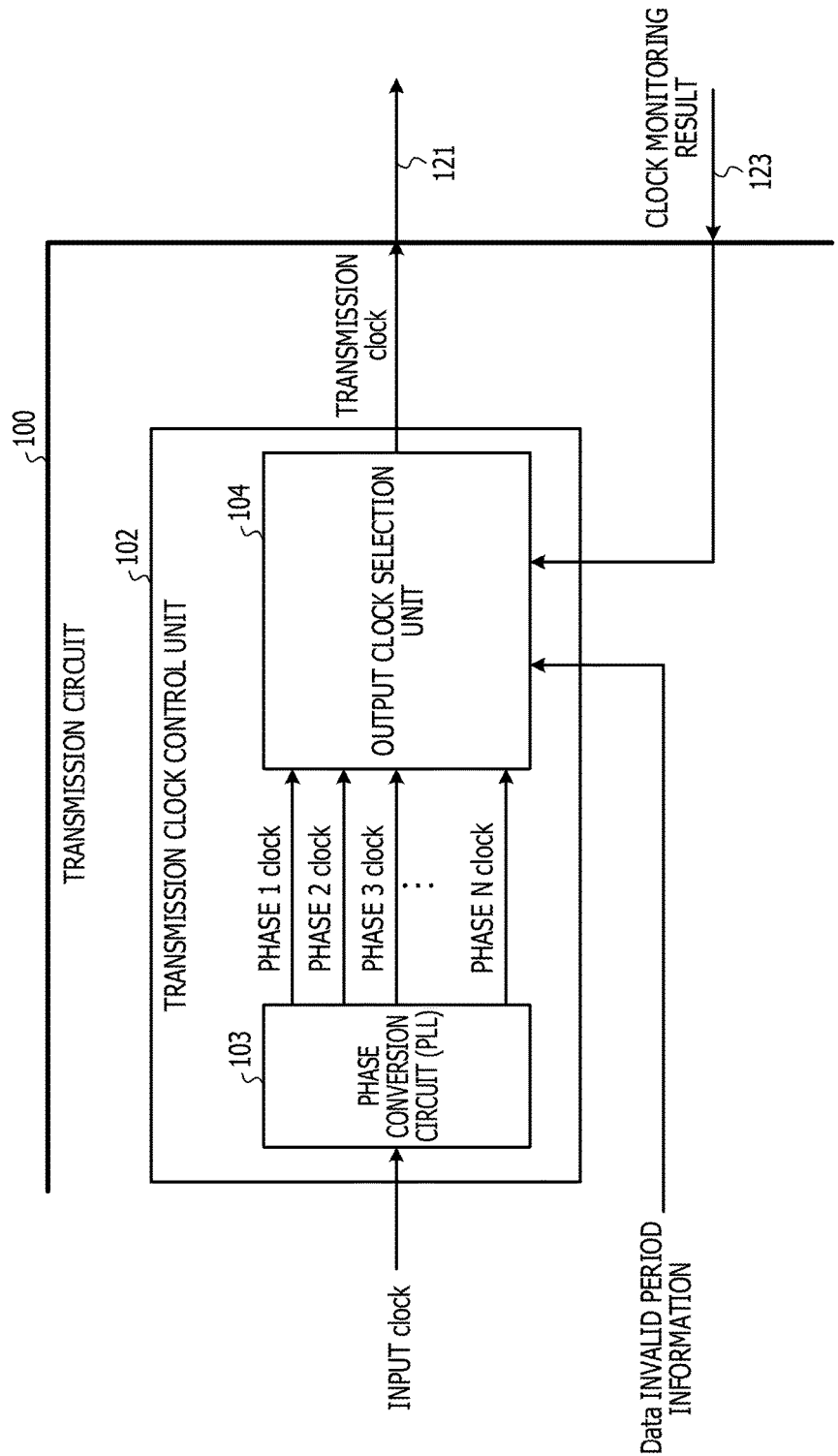
FIG. 14 illustrates an exemplary transmission clock control unit.

FIG. 14 illustrates an exemplary transmission clock control unit. The transmission clock control unit 102 incudes a phase conversion circuit 103, such as a phase locked loop (PLL) or the like, and an output clock selection unit 104. The phase conversion circuit 103 generates a plurality of clocks of different phases (a phase 1 to a phase N) from a clock that is input to the transmission circuit 100 at the transmission side chip. The output clock selection unit 104 performs phase adjustment of a transmission clock, based on the data invalid period information and a clock monitoring result that has been fed back from the reception side chip. For example, if a data invalid period is indicated and the clock monitoring result that has been fed back indicates that phase adjustment is desired to be performed, phase adjustment is performed.

Figure 15:
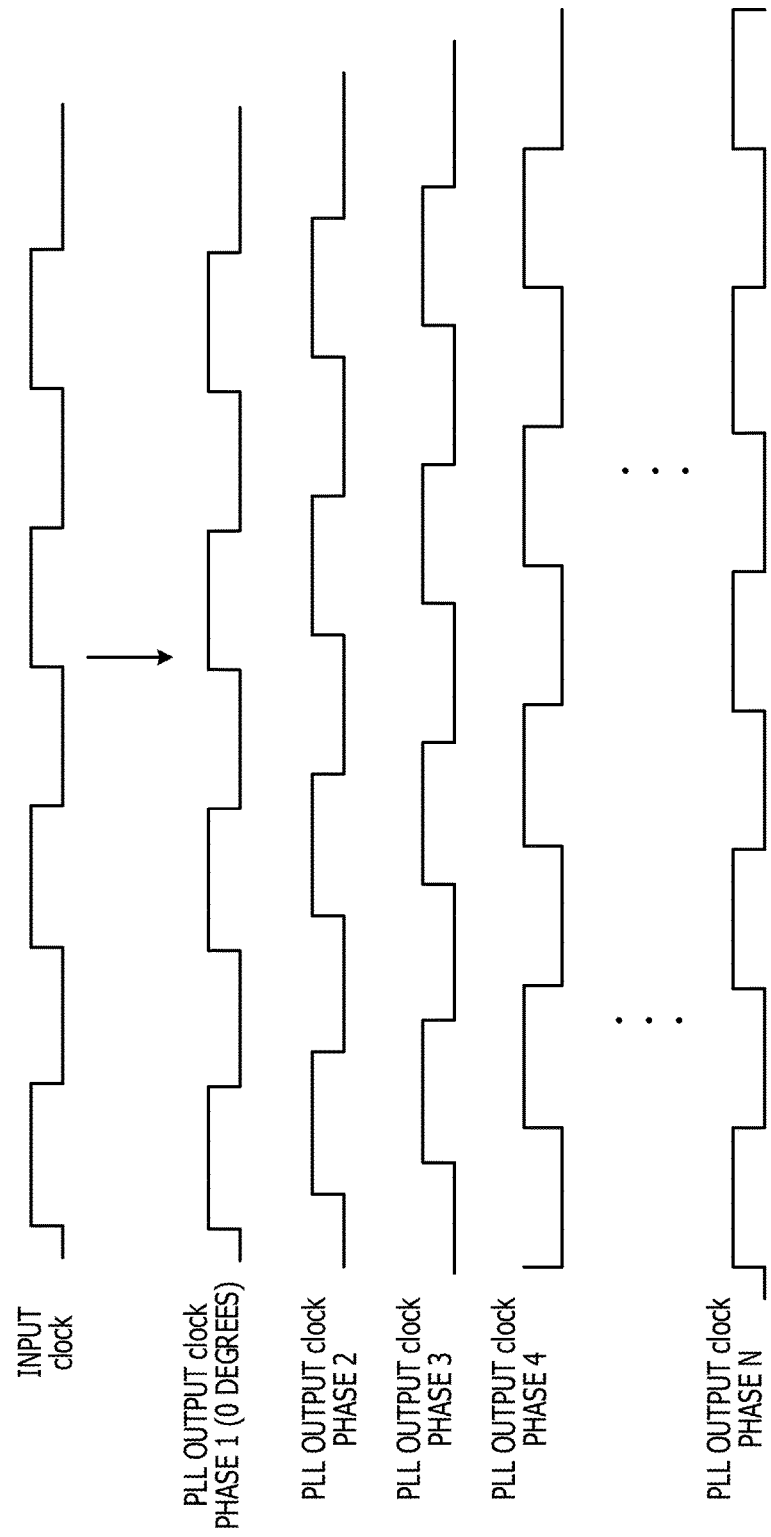
FIG. 15 illustrates an example of a plurality of clocks of different phases.

FIG. 15 illustrates an example of a plurality of clocks of different phases. FIG. 15 illustrates an example of a plurality of clocks of different phases, which are generated in the transmission clock control unit, for example, the phase conversion circuit 103. For example, phases ranging from the phase 1 (a phase difference is 0 degrees), which is the same phase as that of an input clock, to a phase N are generated in accordance with a predetermined step size. A phase difference is set such that an Nth phase has a largest shift amount from the input clock. A phase shift amount from the input clock sequentially increases in the order of the phase 1, the phase 2, . . . , becomes the largest at the phase N, and returns back to the same phase as the initial phase of the input clock at the (N+1)th phase.

Figure 16:
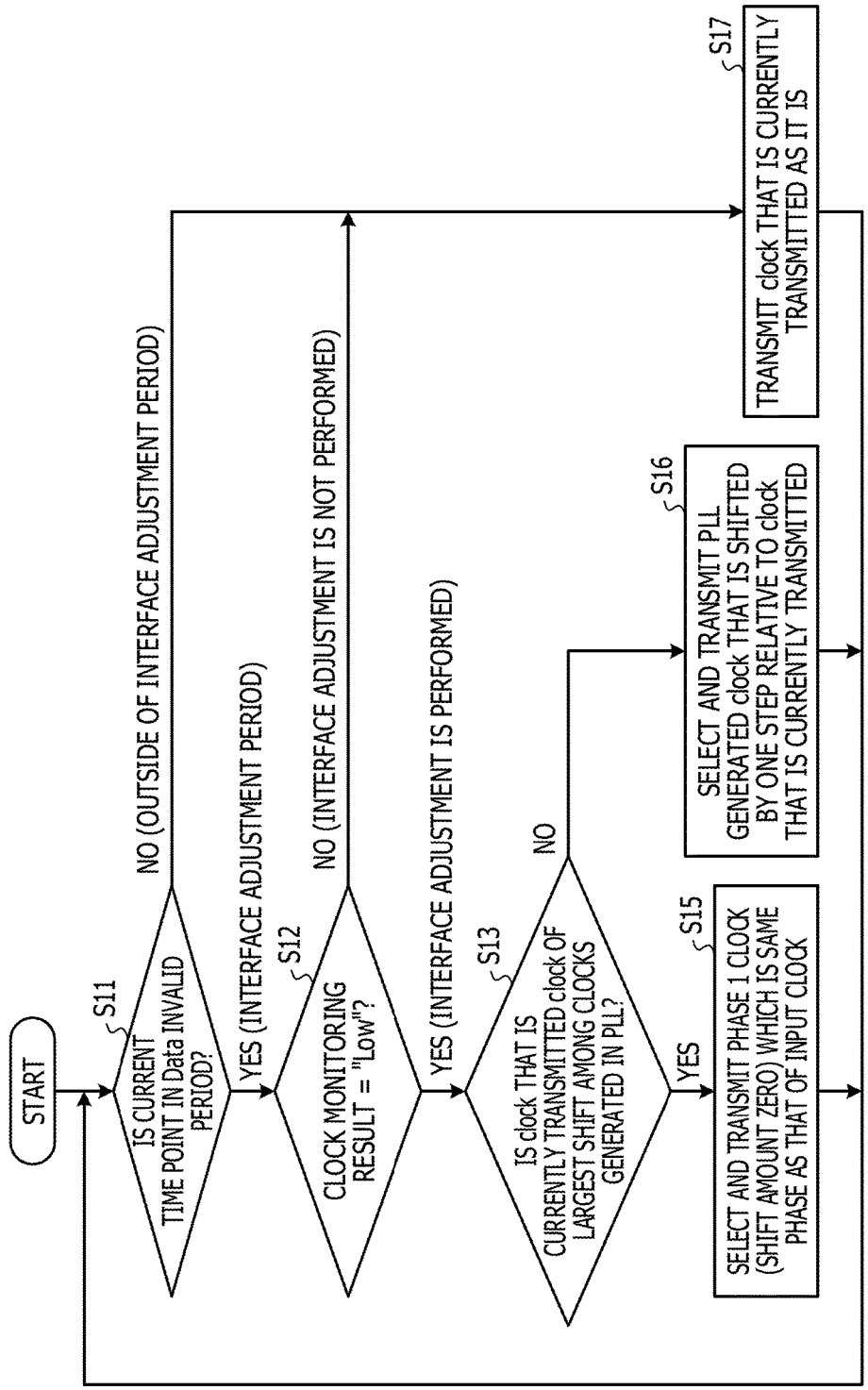
FIG. 16 illustrates an exemplary operation of an output clock selection unit of a transmission clock control unit.

FIG. 16 illustrates an exemplary operation of an output clock selection unit. Whether or not a current time point is in a data invalid period is determined (S11). If the current time point is not in a data invalid period, the current time point is outside of a period of an interface timing adjustment, and therefore, a clock that is currently transmitted, for example, a clock that has been selected in a previous interface timing adjustment period, is transmitted as it is (S17) and the process returns to Operation S11.

If the current time point is in a data invalid period (Yes in S11), the current timing point corresponds to an interface timing adjustment period and whether or not the clock monitoring result that has been fed back from the reception circuit 200 indicates that phase adjustment is desired to be performed, for example, whether or not a signal value is "Low", is determined (S12). If the clock monitoring result indicates that phase adjustment is not desired to be performed, for example, if the signal value is "High", a phase relation between each of all the data that have been transmitted in parallel and the clock is maintained in the reception side chip. In this case, the clock that is currently transmitted is transmitted as it is (S17) and the process returns to Operation S11.

If the clock monitoring result indicates that phase adjustment is desired to be performed, for example, if the signal value is "Low" (Yes in S12), whether or not the clock that is currently transmitted is a clock of the largest shift amount among phase clocks generated by the phase conversion circuit 103 is determined (S13). If the current clock is not a clock of the largest shift amount (No in S13), a phase clock obtained by shifting the phase of the current clock by one step is selected from the phase clocks generated by the phase conversion circuit 103 and is transmitted (S16). For example, if the cock that is currently transmitted is a clock of a phase 3 in FIG. 15, a phase difference is increased by one step and a clock of a phase 4 is selected. Thereafter, the process returns to Operation S11.

If the current clock is a clock of the largest shift amount (Yes in S13), a clock of the phase 1 (the shift amount is zero), which is the same phase as that of the input clock, is selected and transmitted (S15). This processing corresponds to processing in which, after one round from the Nth phase clock of the largest shift amount, the phase is caused to return back to the initial phase, and is equivalent to processing in which the phase clock of the largest shift amount is shifted by one step in the same direction. Thereafter, the process returns to Operation S11. Operations S11 to S17 may be repeatedly performed while the transmission device 10 is operated. Based on the clock monitoring result that is fed back from the reception side chip, Operations S11 to S17 are repeated until phase adjustment of a transmission clock is no longer desired, and thereby, phase adjustment of a transmission clock is dynamically performed. Such phase adjustment is performed in the data invalid period, and therefore, a transmission service to a client device is not influenced. In a valid data transmission period, using a clock on which phase adjustment has been performed in the immediately previous data invalid period, data transmission is performed in a state in which the phase relation between data and a clock is correctly maintained.

Figure 17:
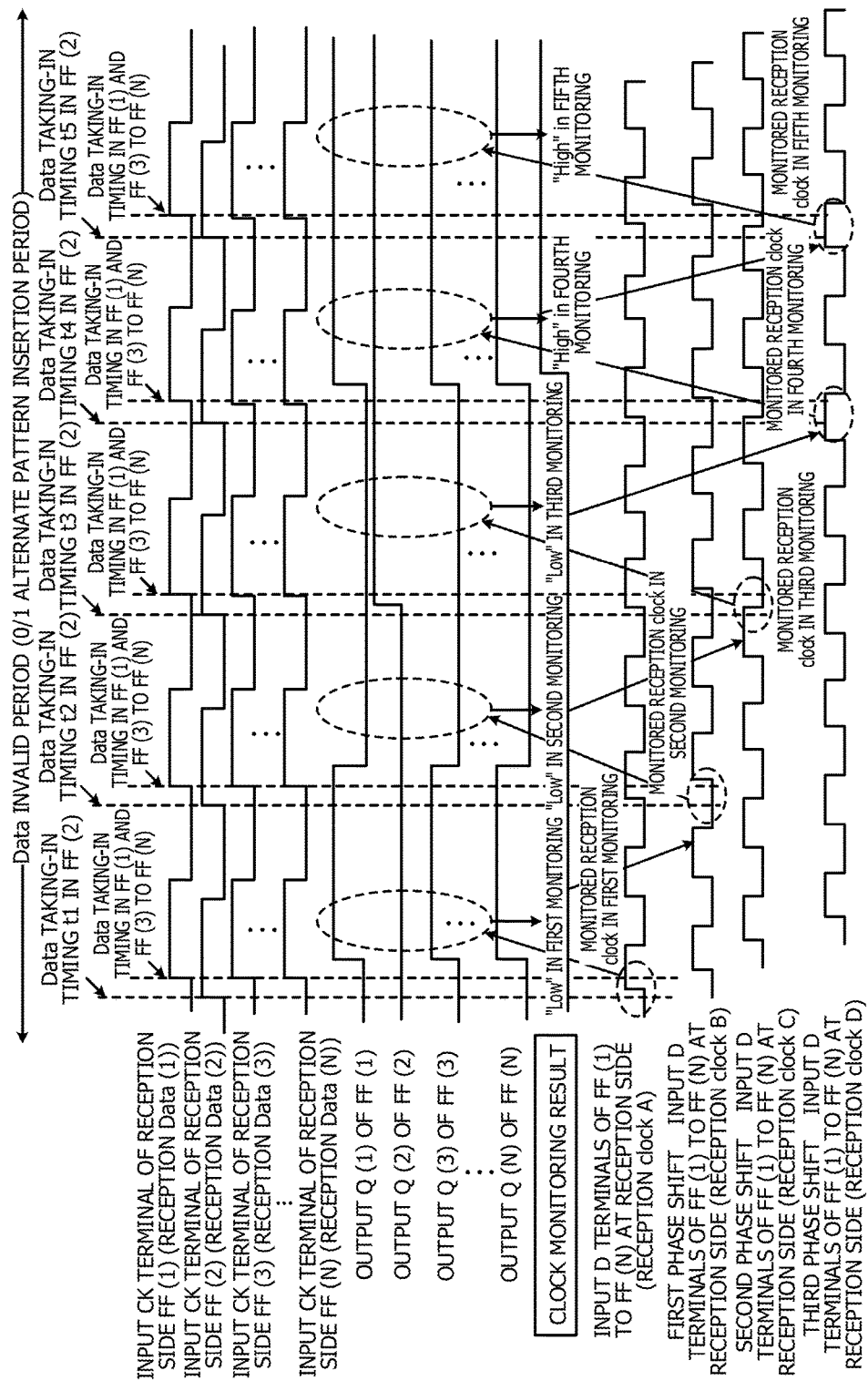
FIG. 17 illustrates an exemplary operation of a transmission clock control unit.

FIG. 17 illustrates an exemplary operation of a transmission clock control unit. In FIG. 17, similarly to the example of FIG. 13, an appropriate phase relation is lost in reception data (2) that is input to the CK terminal of FF(2) in the reception side chip. At a data rise taking-in timing (a rising timing) t1 of the reception data (2), a High state of a reception clock A that is input to the D terminals of FF (1) to FF (N) illustrated in a fourth part from the bottom in FIG. 17 is not latched. Therefore, an output Q (2) of FF(2) is "Low" or "0".

The transmission clock control unit 102 receives a "Low" signal as a clock monitoring result. When the transmission clock control unit 102 receives a first clock monitoring result, the transmission clock control unit 102 performs first phase shift. As a result of the shift, the phase of a transmission clock is shifted by only a predetermined amount and the waveform of a reception clock B that is input to the D terminals of FF (1) to FF (N) at the reception side is a waveform of a phase delayed by a predetermined time, as illustrated in a third part from the bottom.

Also, at a next data taking-in timing t2 in FF(2), the High state of the reception clock B is not latched. With the first clock monitoring result, the phase of the transmission clock has been shifted, and thereby, not only in FF(2) but also in FF (1) and FF (3) to FF (N), the High state of the reception clock B that has been input to the D terminal is not latched at a rising edge of input data. Therefore, each of the outputs Q(1) to Q(N) of FF (1) to FF (N) is "0" and a second clock monitoring result is also "Low".

When the transmission clock control unit 102 receives the second clock monitoring result, the transmission clock control unit 102 performs a second phase shift of the transmission clock. The waveform of a reception clock C that is input to the D terminals of FF (1) to FF (N) at the reception side is a waveform of a phase further delayed, as illustrated in a second part from the bottom.

At a next input data rising timing t3 in FF(2), the High state of the reception clock C is latched, but the High state of the reception clock C is not latched in the other FF (1) and FF (3) to FF (N). Therefore, a third clock monitoring result is also "Low".

When the transmission clock control unit 102 receives the third clock monitoring result, the transmission clock control unit 102 performs a third phase shift of the transmission clock. The waveform of a reception clock D that is input to the D terminals of FF (1) to FF (N) at the reception side is a waveform at the bottom.

At a next input data rising timing t4 in FF (2), the High state of the reception clock D is latched. In the other FF (1) and FF (3) to FF (N), at an input data rise, the High state of the reception clock D is not latched. As a result, a fourth clock monitoring result is "High". For example, in all of N reception data, the phase relation with a clock is correctly maintained.

When the transmission clock control unit 102 receives the clock monitoring result "High", the transmission clock control unit 102 maintains the transmission clock generated by the third phase shift. At the reception side, the reception clock D is fixed and, in a next valid data interval, a phase relation between valid data and a clock is correctly maintained until the data and the clock reach the reception side chip.

As described above, timing adjustment of high speed interface may be performed in a simple circuit by taking in a clock signal using a reception side input data signal without using a physical delay element. Reduction in the circuit size may be achieved. As the transmission speed increases, the number of parallel signal processing in FPGA/ASIC increases, and therefore, the above-described advantage may be increased. Clock phase adjustment is performed using a data invalid period, and therefore, a data transmission service for a client device may not be influenced.

The above-described configuration and operation are merely examples. For example, in the reception clock monitoring unit 201, the output level of the all 1 determination unit 203 when phase adjustment is not desired to be performed may be reversed. The all 1 determination unit 203 may be formed of a NAND circuit and be configured to, when each of outputs of all of the FFs 204 is 1, output "Low" or "0".

For example, in FIG. 4, data invalid period information may be supplied to the reception circuit 200 and input of reception data and a reception clock to the reception clock monitoring unit 201 and clock monitoring may be performed only in a data invalid period.

For example, instead of shifting a phase adjustment shift amount by one step at one time by an operation of the output clock selection unit, which is illustrated in FIG. 16, a shift of a plurality of steps may be performed at one time. Phase adjustment is not limited to phase adjustment performed by performing a shift in a direction in which the phase is delayed, but may be performed by performing a shift in a direction in which the phase is advanced.

For example, in FIG. 16, if a clock monitoring result indicates that phase adjustment is desired to be performed, without performing, in Operation S13, determination on whether or not a clock that is currently being transmitted is a clock of a largest shift, a shift of a phase may be performed in Operation S16. In this case, processing from Operation S11 is repeated until a clock monitoring result from the reception circuit 200 indicates that phase adjustment is not desired to be performed. Also, in this method, an interface timing may be adjusted in a simple configuration by a simple method without influencing valid data.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A transmission device comprising:
a reception circuit; and
a transmission section that is disposed between the reception circuit and a transmission circuit and transmits a clock signal and a plurality of data signals in parallel, wherein
the transmission circuit performs operations of:
inserting a predetermined pattern in a data invalid period of each of the data signals;
outputting the each of the data signals in which the predetermined pattern has been inserted in synchronization with an input clock; and
adjusting a phase of the clock signal in the data invalid period,
the reception circuit performs operations of:
detecting a state of a reception clock using the each of the data signals in which the predetermined pattern has been inserted; and
determining whether or not phase adjustment of the clock signal is to be performed, based on the state of the reception clock, and
the transmission circuit adjusts the phase of the clock signal, based on a determination result.

2. The transmission device according to claim 1, wherein the reception circuit includes a logic circuit that is provided correspondingly to each of the plurality of data signals that are input, and
the reception clock is input to a data terminal of each of the logic circuits and a corresponding reception data signal is input to a clock terminal of each of the logic circuits.

3. The transmission device according to claim 2, wherein each of the logic circuits detects the state of the reception clock at a rising timing of the corresponding reception data signal.

4. The transmission device according to claim 2, wherein when each of outputs of all of the logic circuits is true, the reception circuit outputs the determination result indicating that phase adjustment of the clock signal is not to be performed.

5. The transmission device according to claim 4, wherein when the reception circuit receives, in the data invalid period, the determination result indicating that phase adjustment of the clock signal is to be performed, the reception circuit shifts the phase of the clock signal until each of the outputs of all of the logic circuits is true.

6. The transmission device according to claim 4, wherein the reception circuit:
generates a plurality of clocks of different phases from the input clock, and
sequentially selects and outputs the plurality of clocks until each of the outputs of all of the logic circuits is true, when receiving, in the data invalid period, the determination result indicating that phase adjustment of the clock signal is to be performed.

7. The transmission device according to claim 1, wherein the predetermined pattern includes an alternate pattern of 0 and 1.

8. The transmission device according to claim 1, wherein the reception circuit generates a plurality of clocks of different phases from the input clock in order to adjust the phase of the clock signal, and
a number of repeats of a pattern having 0 and 1 in the predetermined pattern is larger than the number of the plurality of clocks.

9. A signal processing method comprising:
inserting a predetermined pattern in a data invalid period of each of a plurality of data signals in a transmission circuit coupled with a reception circuit via a transmission section that transmits a clock signal and the plurality of data signals in parallel between the transmission circuit and the reception circuit,
outputting in synchronization with an input clock the each data signal in which the predetermined pattern has been inserted,
detecting, in the reception circuit, a state of a reception clock using the each data signal in which the predetermined pattern has been inserted,
determining whether or not phase adjustment of the clock signal is to be performed, based on the state of the reception clock, which has been detected, and feeding back a determination result to the transmission circuit, and
causing the transmission circuit to adjust a phase of the clock signal, based on the determination result.

10. The signal processing method according to claim 9, wherein
the reception circuit includes a logic circuit that is provided correspondingly to each of the plurality of data signals that are input, and
the reception clock is input to a data terminal of each of the logic circuits and a corresponding reception data signal is input to a clock terminal of each of the logic circuits.

11. The signal processing method according to claim 10, wherein
each of the logic circuits detects the state of the reception clock at a rising timing of the corresponding reception data signal.

12. The signal processing method according to claim 10, wherein
when each of outputs of all of the logic circuits is true, the reception circuit outputs the determination result indicating that phase adjustment of the clock signal is not to be performed.

13. The signal processing method according to claim 12, wherein
when the reception circuit receives, in the data invalid period, the determination result indicating that phase adjustment of the clock signal is to be performed, the reception circuit shifts the phase of the clock signal until each of the outputs of all of the logic circuits is true.

14. The signal processing method according to claim 12, wherein
the reception circuit:
generates a plurality of clocks of different phases from the input clock, and
sequentially selects and outputs the plurality of clocks until each of the outputs of all of the logic circuits is true, when receiving, in the data invalid period, the determination result indicating that phase adjustment of the clock signal is to be performed.

15. The signal processing method according to claim 9, wherein
the predetermined pattern includes an alternate pattern of 0 and 1.

16. The signal processing method according to claim 9, wherein
the reception circuit generates a plurality of clocks of different phases from the input clock in order to adjust the phase of the clock signal, and
a number of repeats of a pattern having 0 and 1 in the predetermined pattern is larger than the number of the plurality of clocks.

* * * * *